US012660634B2

(12) United States Patent
Su et al.

(10) Patent No.: US 12,660,634 B2
(45) Date of Patent: *Jun. 16, 2026

(54) SEMICONDUCTOR PACKAGE WITH INTEGRATED CAPACITORS

(71) Applicant: Chipletz, Inc, Spicewood, TX (US)

(72) Inventors: Michael Su, Austin, TX (US); Michael Alfano, Austin, TX (US); Siddharth Ravichandran, Austin, TX (US)

(73) Assignee: Chipletz, Inc., Spicewood, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/207,750

(22) Filed: May 14, 2025

(65) Prior Publication Data

US 2025/0273604 A1      Aug. 28, 2025

Related U.S. Application Data

(62) Division of application No. 18/773,010, filed on Jul. 15, 2024, now Pat. No. 12,334,455, which is a division of application No. 17/692,587, filed on Mar. 11, 2022, now Pat. No. 12,288,756.

(51) Int. Cl.
| | |
|---|---|
| *H10W 44/00* | (2026.01) |
| *H10D 1/00* | (2025.01) |
| *H10D 1/68* | (2025.01) |
| *H10W 70/65* | (2026.01) |
| *H10W 70/685* | (2026.01) |
| *H10W 90/00* | (2026.01) |

(52) U.S. Cl.
CPC .......... *H10W 44/601* (2026.01); *H10D 1/042* (2025.01); *H10D 1/043* (2025.01); *H10D 1/716* (2025.01); *H10W 70/65* (2026.01); *H10W 70/685* (2026.01); *H10W 90/00* (2026.01); *H10W 90/701* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 6,876,554 | B1 * | 4/2005 | Inagaki | H01L 23/642 |
| | | | | 257/E23.079 |
| 10,756,707 | B1 * | 8/2020 | Wagner | H01G 4/00 |
| 2007/0045815 | A1 * | 3/2007 | Urashima | H01L 23/5383 |
| | | | | 257/E23.079 |
| 2007/0134925 | A1 * | 6/2007 | Eilert | H01L 24/97 |
| | | | | 257/E23.079 |
| 2007/0158818 | A1 * | 7/2007 | Tang | H01L 23/50 |
| | | | | 257/E23.079 |
| 2007/0258225 | A1 * | 11/2007 | Inagaki | H05K 1/187 |
| | | | | 361/763 |

(Continued)

*Primary Examiner* — Nicholas J Tobergte
(74) *Attorney, Agent, or Firm* — Artie Pennington Law Offices, PLLC; Artie Pennington; Hannah Ward

(57) ABSTRACT

In one aspect, a capacitor or network of capacitors is/are provided for vertical power delivery in a package where the capacitor(s) is/are embedded in or forms the entirety of the package substrate core. In a second aspect, a plurality of thin-film capacitor structures are provided for implementing vertical power delivery in a package. In a third aspect a method is provided for fabricating hermetically sealed thin-film capacitors.

17 Claims, 13 Drawing Sheets

(56)                 References Cited

U.S. PATENT DOCUMENTS

2007/0263364 A1* 11/2007 Kawabe ............... H05K 1/0231
                                            257/E23.079
2012/0241906 A1*  9/2012 Nakanishi ......... H01L 23/49822
                                            257/532
2020/0273812 A1*  8/2020 Lin .................... H01L 23/3185

* cited by examiner

405

400

410

400

405

COAT BOTH TOP/BOTTOM ON THIN-FILM SHEET WITH HERMETIC SEAL    430

FABRICATE ANODE AND CATHODE    440

SINGULATE THIN-FILM SHEET    450

COAT BOTH ADJACENT SIDES OF SHEET WITH ADDITIONAL HERMETIC SEAL    460

420

FABRICATE THIN-FILM CAPACITORS — 730

EMBED THIN-FILM CAPACITORS IN SUBSTRATE CORE — 740

COAT ALL SIDES OF THIN-FILM CAPACITORS WITH HERMETIC SEAL — 750

700

820

810

800

830 FABRICATE THIN-FILM STACK

840 COAT TOP AND BOTTOM OF THIN-FILM STACK WITH HERMETIC SEAL

850 SURROUND WITH INSULATOR AND FABRICATE ANODE AND CATHODE

930 — FABRICATE THIN-FILM STACK

940 — TRENCHING/DRILLING THROUGH TIN-FILM STACK

950 — COAT ALL SIDES OF THIN-FILM STACK WITH HERMETIC SEAL

960 — SURROUND WITH INSULATOR AND METALLIZATION TO FORM ANODE/CATHODE

SEMICONDUCTOR PACKAGE WITH INTEGRATED CAPACITORS

CROSS-REFERENCE TO RELATED APPLICATIONS

This application is:
1. a divisional application of U.S. patent application Ser. No. 18/773,010, filed 15 Jul. 2024 ("First Divisional Application")
2. which in turn is a divisional application of U.S. patent application Ser. No. 17/692,587, filed 11 Mar. 2022, now U.S. Pat. No. 12,288,756, issued 29 Apr. 2025 ("Parent Application").

This application claims priority to:
3. the First Divisional Application; and
4. the Parent Application;

collectively, "Priority References", and hereby claims benefit of the filing dates thereof pursuant to 37 C.F.R. § 1.78(a)(4).

The subject matter of the Priority References, each in its entirety, is expressly incorporated herein by reference.

FIELD OF THE INVENTION

The present invention is directed to semiconductor packages and in particular to flip chip packages with integrated capacitors, and to thin-film capacitor structures, and to sealing of thin-film capacitors.

BACKGROUND

Semiconductor packages, such as flip chip packages, are known in the art for interconnecting surface attachable devices (e.g., semiconductor devices, IC chips, integrated passive devices, microelectromechanical systems (MEMS) or other electrical, optical, mechanical, thermal, magnetic, quantum etc. devices), to external circuitry (e.g. printed circuit board (PCB)) via interconnects. First-level interconnects are located between the surface attachable devices and the package and second-level interconnects are located between the package and the board. Interconnects may also be located between the package and capacitors for power delivery, noise filtering, etc.

In order to mount a conventional flip chip to external circuitry, such as a circuit board, the chip is singulated or cut into individual chips which are then flipped over so that the top side faces down. The chip pads are aligned with matching pads on the external circuitry, and the solder bumps are then reflowed to make a connection between the singulated chip and the external circuitry.

A package may include a redistribution layer (RDL) forming an interface between the surface attachable device and the package. An RDL is an extra metal layer consisting of wiring on top of core metals that can be used, for example to make 1/0 pads of a semiconductor die available for bonding out to other locations such as bump pads. Bumps are usually placed in a grid pattern and each one is molded with two pads (one on the top and one on the bottom) that are then attached to the RDL and package substrate, respectively. The RDL, therefore, serves as a layer connecting 1/0 pads and bump pads.

In flip chip design a 2D architecture is defined as an architecture where two or more active silicon devices are placed side-by-side on a package and are interconnected on the package. For example, a 2.5D package includes multiple dies inside the same package, where communication between chips is accomplished using either a silicon or organic interposer, while a 2.1D package includes multiple dies inside the same package with a few high-density wiring layers to interconnect the chips and coarser wiring layers to fanout to the external circuitry. A typical 2.1D package can replace a 2.5D interposer and a traditional organic substrate package.

It is known to use decoupling capacitors in flip chips for suppressing power supply noise in DC signals transmitted to the semiconductor die from the external circuitry. Such decoupling capacitors typical include terminals on left and right sides for lateral power delivery while filtering AC noise from being transmitted to the die, which requires either lateral signal routing through the capacitor or placement of the capacitor on the surface of the package, both of which contribute to RC signal delays and negatively impact device density.

SUMMARY OF THE INVENTION

It is an aspect of the present invention to provide a capacitor for vertical power delivery in a package where the capacitor is embedded in or forms the entirety of the package substrate core.

In another aspect, a plurality of thin-film capacitor structures are provided for vertical power delivery in a package.

In a further aspect, a method is provided for fabricating sealed thin-film capacitors.

According to an embodiment, there is provided in a package, a substrate core with a top surface and a bottom surface; a capacitor with a top surface and bottom surface, where the capacitor forms at least a portion of the substrate core with the top surface of the capacitor substantially co-planar with the top surface of the substrate core and the bottom surface of the capacitor substantially co-planar with the bottom surface of the substrate core; a top redistribution layer formed on the top surface of the substrate core, and adapted to facilitate electrical connection to the top surface of the capacitor; a bottom redistribution layer formed on the bottom surface of the substrate core, and adapted to facilitate electrical connection to the bottom surface of the capacitor; and an electrical connection extending vertically through the capacitor, but electrically isolated from the capacitor.

According to another embodiment, there is provided a package adapted to couple a semiconductor die to external circuitry, the package comprising: a first level interconnect having a top contact adapted to be coupled to the semiconductor die, and a bottom contact; a substrate core comprising a capacitor having a top terminal coupled to the bottom contact of the first level interconnect, and a bottom terminal; a redistribution layer having a top contact coupled to the bottom terminal of the capacitor, and a bottom terminal; and a second level interconnect having a top contact coupled to the bottom terminal of the redistribution layer, and a bottom contact adapted to be coupled to the external circuitry.

According to another embodiment, there is provided a package adapted to couple a semiconductor die to external circuitry, the package comprising: a first level interconnect having a top contact adapted to be coupled to the semiconductor die, and a bottom contact; a redistribution layer having a top contact coupled to the bottom contact of the first level interconnect, and a bottom contact; a substrate core comprising a capacitor having a top terminal coupled to the bottom contact of the redistribution layer, and a bottom terminal; and a second level interconnect having a top contact coupled to the bottom terminal of the capacitor, and a bottom contact adapted to be coupled to the external circuitry.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE PREFERRED EMBODIMENTS

Figures 1A, 1B:
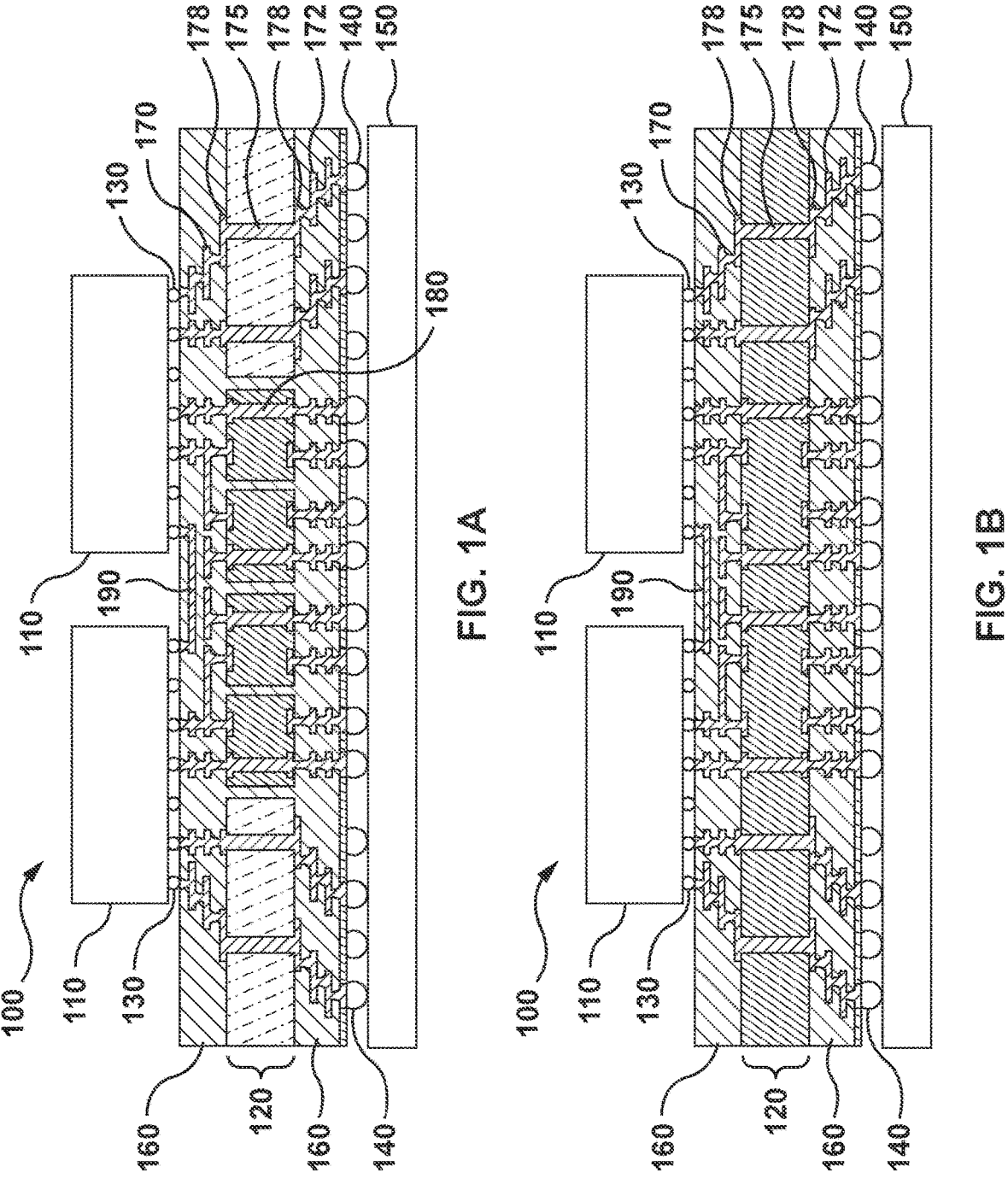
FIGS. 1A, 1B, 1C and 1D show cross section views of different embodiments of capacitors for vertical power delivery in a package where the capacitors are embedded in or form the entirety of the package substrate core, according to aspects of the invention.

As discussed above, this specification sets forth several general aspects, as follows: a first aspect whereby a capacitor or network of capacitors is/are provided for vertical power delivery in a package where the capacitor(s) is/are embedded in or forms the entirety of the package substrate core; a second aspect whereby a plurality of thin-film capacitor structures are provided for implementing vertical power delivery in a package; and a third aspect whereby a method is provided for fabricating sealed thin-film capacitors.

With respect to the first general aspect, FIGS. 1A, 1B, 1C and 1D show cross section views of different embodiments of capacitors for vertical power delivery in a package, such as a flip chip package 100 where the capacitors are embedded in or form the entirety of the package substrate core. As discussed below, the capacitors can be formed as a single component, or as multiple components and embedded in the flip chip substrate, or multiple components packaged/molded as one component before embedding in the flip chip substrate. Multiple capacitors can also be interconnected using capacitor terminal metal or the package redistribution layer (RDL) to form a capacitor network, as discussed below.

The flip chip package 100 has at least one surface attachable device 110, a substrate core 120 (e.g. plastic and/or fiberglass) to which the surface attachable device 110 is mounted on one side via first level interconnects (FLI) 130, such as solder bumps, and second level interconnects (SLI) 140, such as a plurality of solder balls on an opposite side of the substrate core 120 for connection to external circuitry 150, such as a printed circuit board (PCB). A person of skill in the art will understand that the FLI and SLI is not restricted to solder balls/bumps and can include LGA, BGA, etc.) In some applications, as discussed above, the semiconductor dies 110 can be replaced by other semiconductor devices, integrated passive devices, microelectromechanical systems (MEMS) or other components for connection to the external circuitry 150.

At least one capacitor (Cap1, Cap2, . . . Capn-1, Capn in FIGS. 1A, 1C and 1D, and Cap in FIG. 1B), forms at least a portion of the substrate core 120. At least one redistribution layer, RDL 160, is disposed adjacent the capacitor and at least one of the FLI 130 and SLI 140. Wiring 170/172 is provided within the RDL 160 for signal routing between the external circuitry 150, the at least one die 110 and the capacitor(s) through vertical connections, such as vias 175 having top and bottom terminal metals 178 on top and bottom sides of the capacitor(s). At least one further via 180 is provided for vertically passing DC power from the external circuitry 150 to the surface attachable device 110 through the capacitor(s). In embodiments, one or more of the vertical connections 175 and 180 can be plated-through holes (PTHs). Fine-pitch wiring 190 can also be provided in RDL 160 for signaling between semiconductor dies 110.

Figures 1C, 1D:
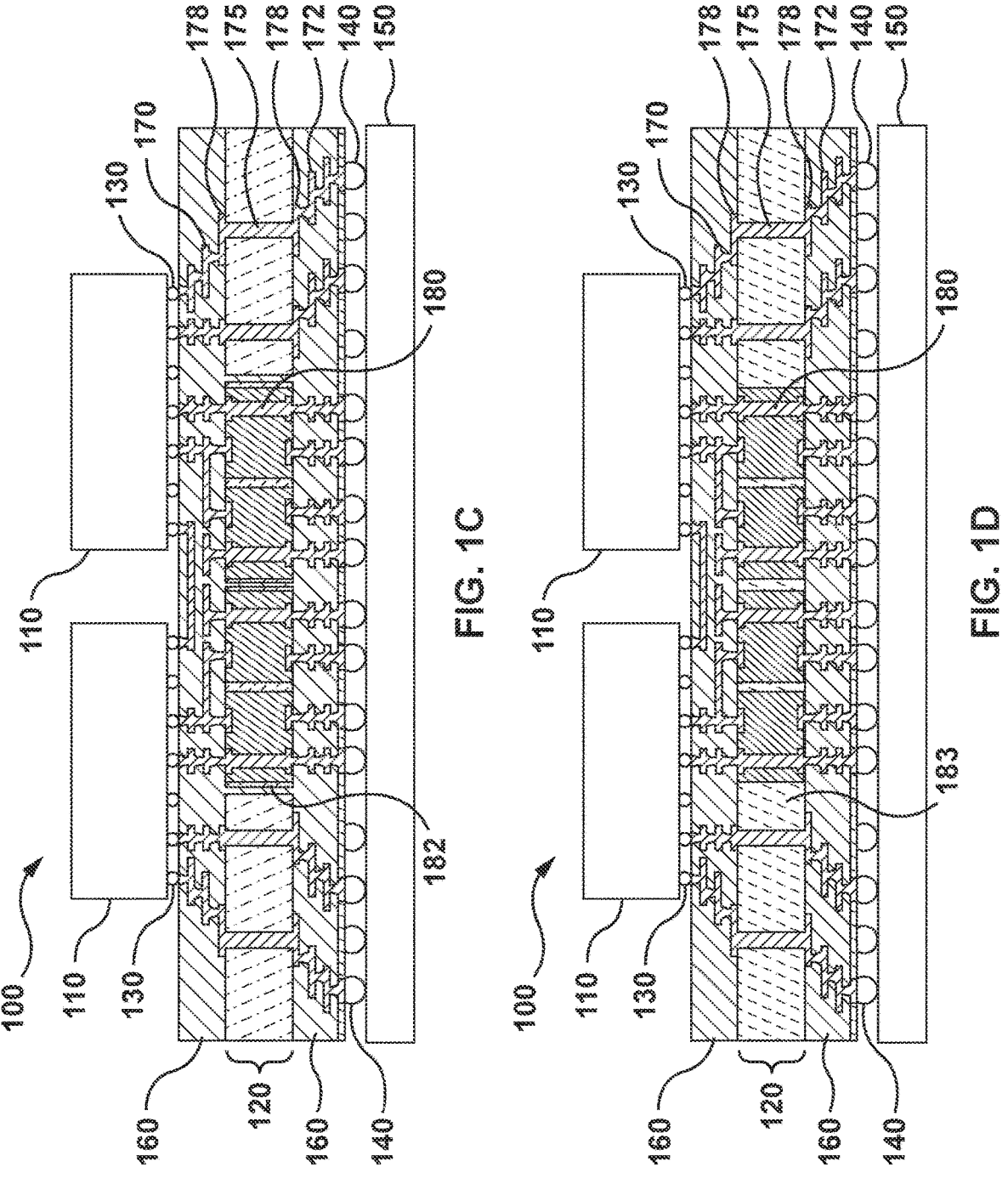
Figures 2A, 2B, 2C:
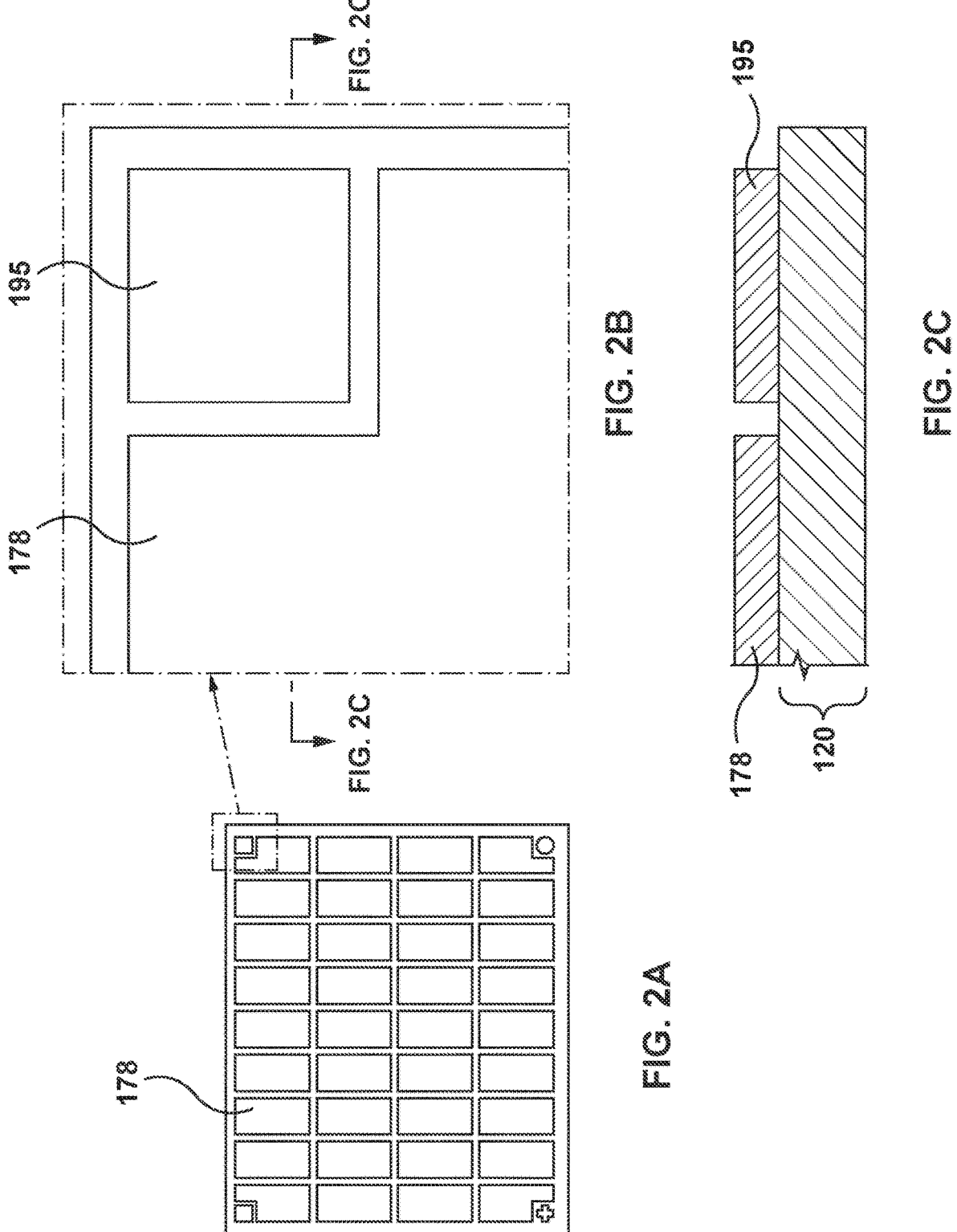
FIGS. 2A, 2B and 2C show plan, exploded plan and cross section views of a sheet of thin film capacitors having terminal metal that can be used as an alignment fiducial for embedding the capacitors in the package substrate core, according to an aspect of the invention.

In FIG. 1A, the capacitors, Cap1, Cap2, . . . , Capn-1, Capn, are embedded in cavities within the substrate core 120, while in FIG. 2B a single capacitor, Cap, forms the entirety of the core 120. In FIG. 1C, the capacitors, Cap1, Cap2, . . . , Capn-1, Capn, are integrated within a capacitor module 182 which is then embedded in the cavities within the substrate core 120, while in FIG. 1D, multiple capacitors, Cap1, Cap2, . . . , Capn-1, Capn, form a portion 183 of the core 120.

Figures 1E, 1F:
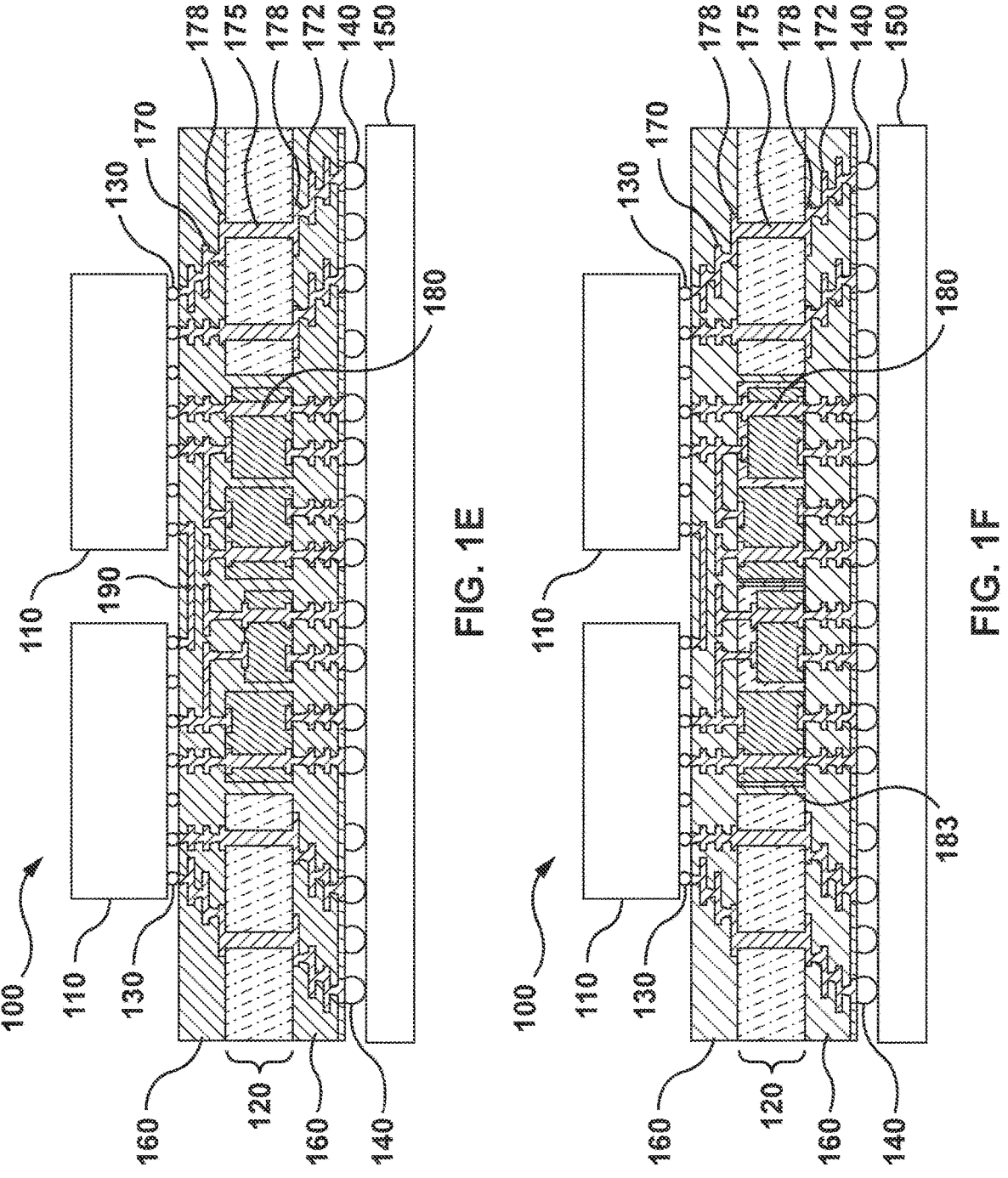
FIGS. 1E, 1F, and 1G are cross section views similar to FIGS. 1A, 1C and 1D where the capacitors are of different sizes, shapes, and thicknesses according to aspects of the invention.
Figures 1G, 1H:
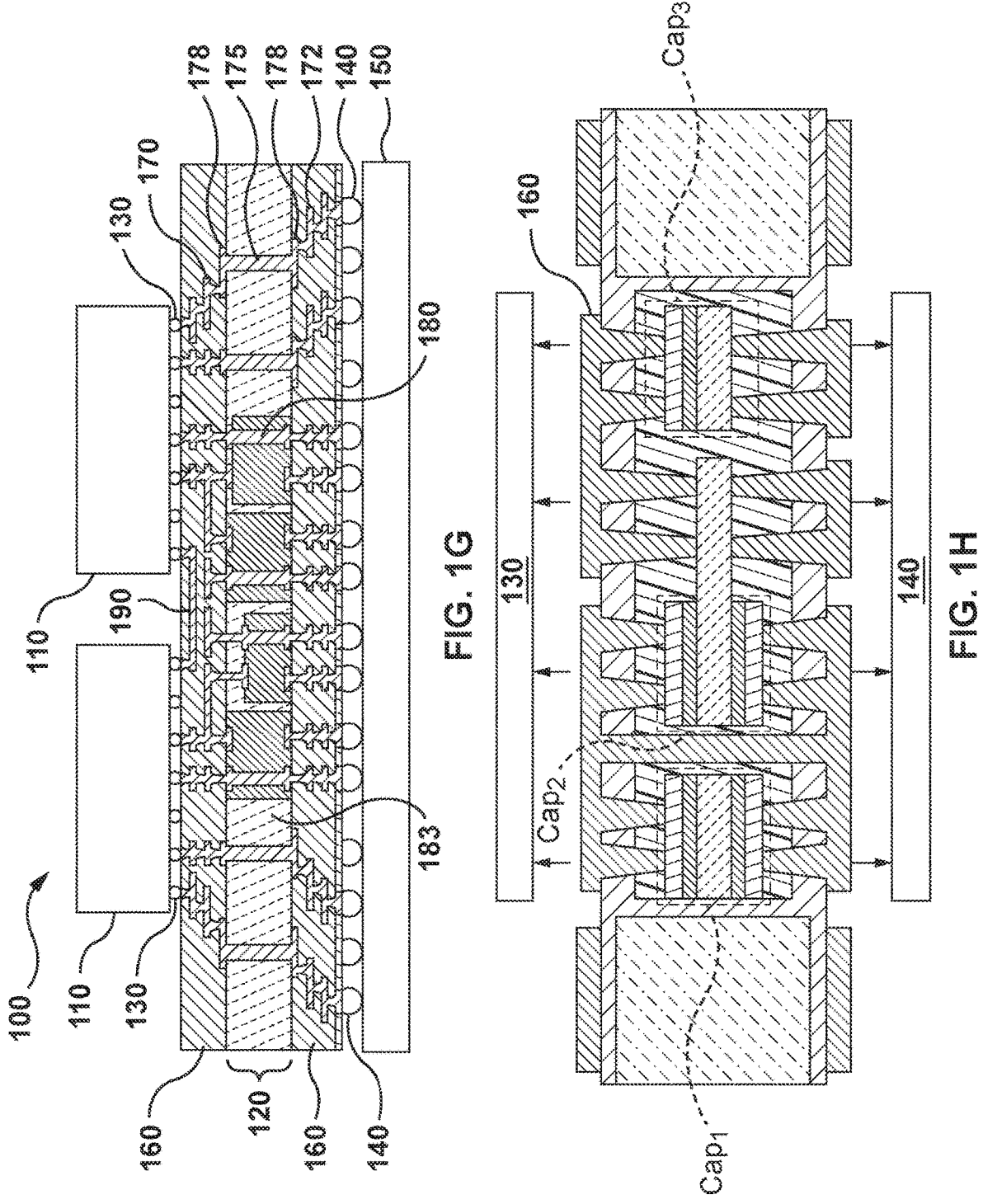
FIG. 1H shows a cross section of view of a network of capacitors formed by terminal metals or redistribution layers of the semiconductor package, according to aspects of the invention.

The capacitors, Cap1, Cap2, . . . , Capn-1, Capn, can be any (regular or irregular) shape, size, or thickness that follows the outline of dies 110, as shown in FIGS. 1E, 1F and 1G, and are designed to support power delivery to the dies 110. The capacitor(s) can be MLCC (multi-layer ceramic cap), thin-film based (Al, Ta, etc.), polymer-cap, etc., and can be a combination of different types of capacitors for different voltages (1.2 V, 5V, 100V depending on the capacitor), frequencies, and densities.

By forming at least a portion of the substrate core 120 with capacitor(s), at least some of the plurality of vertical connections within the RDL 160 can connect the capacitor(s) to the external circuitry 150 and at least one surface attachable device 110 for filtering AC noise from the DC power. Moreover, embedding or forming the substrate core 120 with the capacitor(s) and providing vertical delivery of DC power through the capacitor(s) avoids prior art problems of RC signal delays and poor device density resulting from the use of decoupling capacitors having terminals on left and right sides for lateral power delivery and signal routing through the capacitor or placement of the capacitor on the surface of the package.

As a result of the configurations of FIGS. 1A, 1B, 1C and 1D, terminal metals can be extremely close to each other (e.g. solder bumps on 130 on the bottom of the dies 110 having as small as 80 micron pitch can be made to line up with 80 micron pitch solder balls 140 without routing of DC through the RDL 160). Also, the resulting area dependent cathode and anode result in improved ESR/ESL and current carrying capability due to the increased number of current-carrying vertical connections through and between capacitors.

The package 100 can be a 2.1D flip chip package wherein the RDL 160 between the substrate core 120 and FLI 130 includes fine pitch wiring 170 between the substrate core 120 and semiconductor dies 110 for at least one of interconnecting the plurality of semiconductor dies 110 and forming a network of capacitors Cap1, Cap2, . . . , Capn-1, Capn, in the substrate core 120, as shown in FIG. 1H, and wherein the RDL 160 between the substrate core 120 and SLI 140 includes coarser density wiring 172 for fanning out signals to the external circuitry 150.

In FIG. 1H, RDL 160 (or terminal metal 178) is used to create a network of capacitors (Cap1, Cap2, Cap3), constructed as multiple components or as a single component connected at the terminal metal or RDL level.

To embed the capacitor in the substrate 120, the capacitor must be picked and placed which requires alignment fiducials. This uses up area in the capacitor resulting in lost capacitance. Therefore, according to the embodiment of FIGS. 2A, 2B, 2C and 2D a sheet of thin film capacitors is fabricated having terminal metal 178 that can be used as an alignment fiducial 195 for embedding the capacitors in the package substrate core 120 of the flip chip packages shown in FIGS. 1A, 1C and 1D, wherein the vertical connections 178 from the RDL 160 can be dropped on the terminal metal/alignment fiducial 195. The fiducial 195 can be of any shape, such as a square, rectangle, 'plus' sign, circle, etc.

Figures 2D, 3:
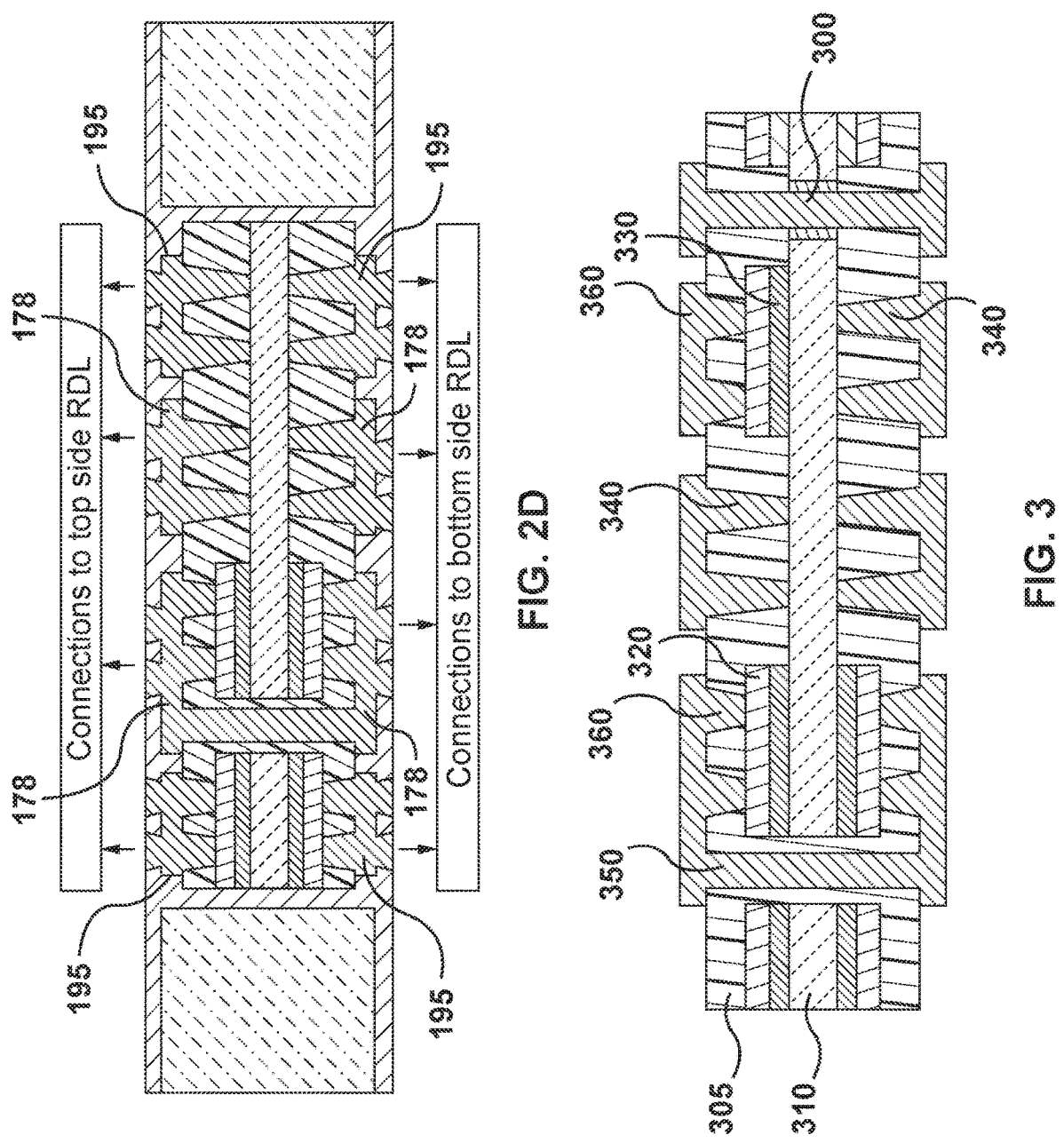
FIG. 2D is a cross section view showing terminal metals that can be used as an alignment fiducials for embedding a network of capacitors in the package substrate core, according to an aspect of the invention.
FIG. 3 shows a cross section view of different embodiments of thin-film capacitors, according to aspects of the invention.

With respect to the second general aspect, FIG. 3 shows a cross section view of different embodiments of thin-film capacitors having an insulator 305, a conductive core 310 within the insulator, at least one first terminal (Terminal 1) forming one of either a cathode or anode connected to the conductive core 310 through the insulator 305, a current collector 320 separated from the conductive core by a dielectric 330, and at least one second terminal (Terminal 2) connected to the current collector forming the other of the cathode or anode.

Terminal 1 can be connected to one of either a top or bottom surface of the conductive core 310 using at least one blind via 340, or to a side surface of the conductive core 310 using at least one plated-through hole with metallic contact to the core 310.

Terminal 2 can include at least one plated-through hole 350 for passing DC current through the conductive core 310 and via(s) 360 for connection to the current collector 320.

In aspects, the thin-film capacitor of FIG. 3 can be sealed with a metal ring of various patterns at the top and bottom of the capacitor periphery for use as a moisture/oxidation barrier, crack-stop, ion gathering, etc. The metal rings can also be used as terminal metal for DC power pass through, or an as alignment mark for pick and place, as discussed above with reference to FIGS. 2A, 2B and 2C.

Figures 3A, 3B, 3C, 3D:
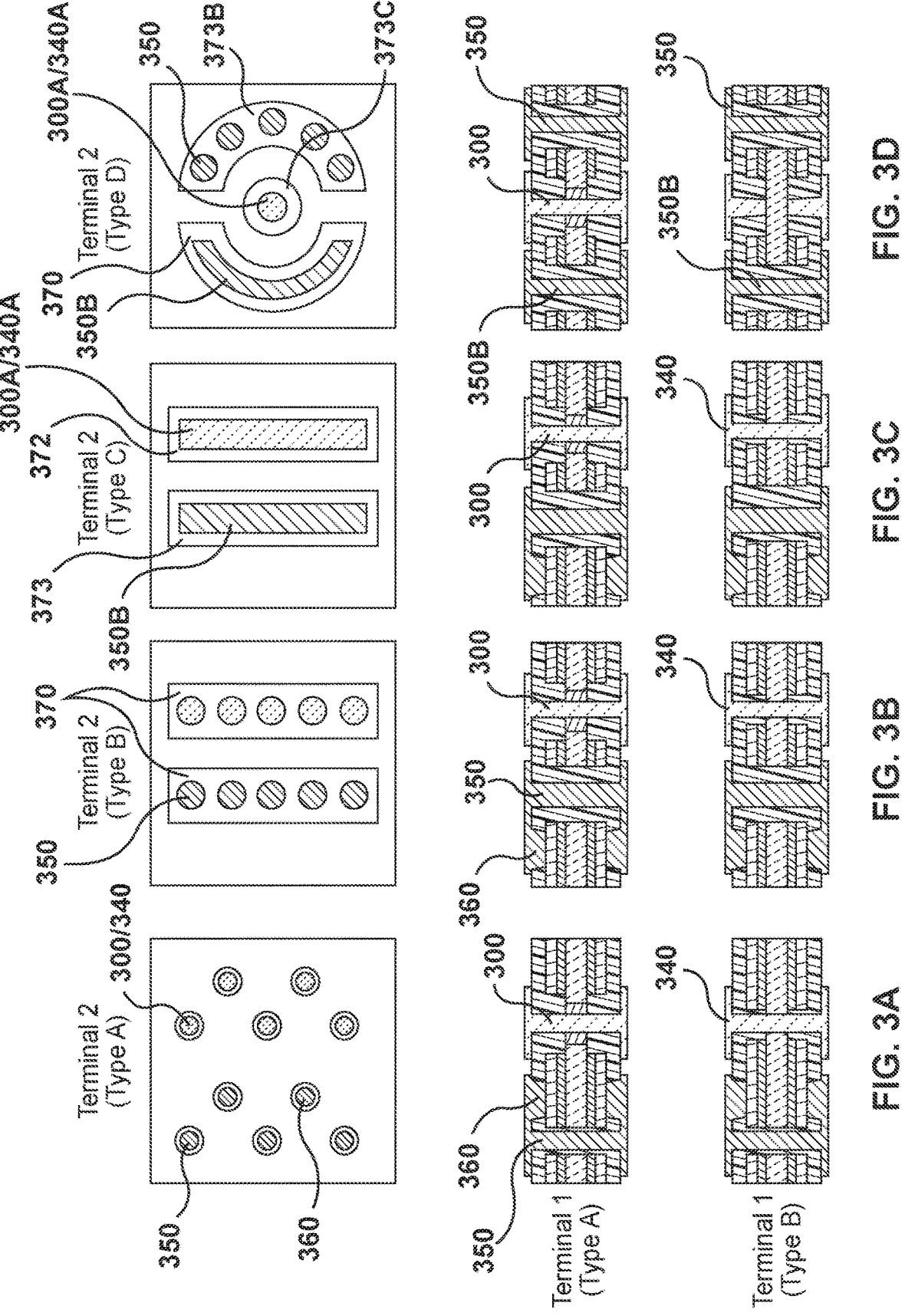
FIG. 3A shows two cross section views of two types of a first terminal and a plan view of a second terminal according to a first embodiment of thin-film capacitor.
FIG. 3B shows two cross section views of two types of a first terminal and a plan view of a second terminal according to second embodiment of thin-film capacitor.
FIG. 3C shows two cross section views of two types of a first terminal and a plan view of a third terminal according to third embodiment of thin-film capacitor.
FIG. 3D shows two cross section views of two types of a first terminal and a plan view of a fourth terminal according to fourth embodiment of thin-film capacitor.

FIG. 3A shows two cross section views of two types of Terminal 1 (Types A and B) and a plan view of Terminal 2 according to a first type of thin-film capacitor (Type A). In the embodiments of FIG. 3A, a plurality of ganged vias 340 and 360 (i.e. isolation holes) are used for connecting Terminal 1 and Terminal 2 to the conductive core 310 and current collector 320, respectively, and a plurality of plated-through holes 300 and 350 are used for vertical DC power delivery and for connecting Terminal 1 to the conductive core 310.

FIG. 3B shows two cross section views of two types of Terminal 1 (Types A and B) and a plan view of Terminal 2 according to a second type of thin-film capacitor (Type B). In the embodiments of FIG. 3B, the plated-through holes 350 for vertical DC power delivery and the plurality of vias 300/340 are respectively ganged together in slots 370 in the insulator 305. The embodiments of FIG. 3B allow for a more densely packed flip chip package than the embodiments of FIG. 3A, since the vias are not required to be individually drilled.

FIG. 3C shows two cross section views of two types of Terminal 1 (Types A and B) and a plan view of Terminal 2 according to a third type of thin-film capacitor (Type C). In the embodiments of FIG. 3C, the plated-through holes 350 and the plurality of vias 300/340 of FIG. 3B are replaced by rectangular trenches 373 and 372, respectively filled with a conductor 350A. The embodiments of FIG. 3C provide lower resistance and therefore higher current carrying capability than the embodiments of FIGS. 3A and 3B.

FIG. 3D shows two cross section views of two types of Terminal 1 (Types A and B) and a plan view of Terminal 2 according to a fourth type of thin-film capacitor (Type D). In the embodiments of FIG. 3D, the rectangular trench 373 of FIG. 3C is replaced by a pair of non-rectangular trenches 373B filled with a semi-circular conductor 350 and vias 350, respectively, and the vias 300/340 of FIGS. 3A and 3B are replaced by a single via 300/340 within a trench 373C which acts as the capacitor anode. In FIG. 3D the non-rectangular trenches 373B are semi-circular, although other shapes may be used.

The following table summarizes the combinations of thin-film capacitor structures available withe configurations of FIGS. 3A-3D.

|            | FIG. 3A     | FIG. 3B     | FIG. 3C     | FIG. 3D     |
|------------|-------------|-------------|-------------|-------------|
| Terminal 1 | Type A or B | Type A or B | Type A or B | Type A or B |
| Terminal 2 | Type A      | Type B      | Type C      | Type D      |

Thus, Terminal 1 can be one of two types: Type A wherein the PTH 300 is connected to the sides of the core 310, or Type B wherein blind vias 340 are dropped to make contact to the core 310. Terminal 2 can be one of four types: Type A (FIG. 3A) wherein multiple blind vias 350 and PTHs 350 are connected to form the terminal; Type B (FIG. 3B) wherein a rectangular slot 370 is provided in the core 310 for ganging many PTHs together; Type C (FIG. 3C) wherein the rectangular slot forms a single large trench 372/373 filled with a conductor 350A and 300A/340A; and Type D (FIG. 3D) wherein the trench is non-rectangular to allow flexibility in capacitor shape while improving performance (e.g. lowering series inductance).

Figures 9A, 9B:
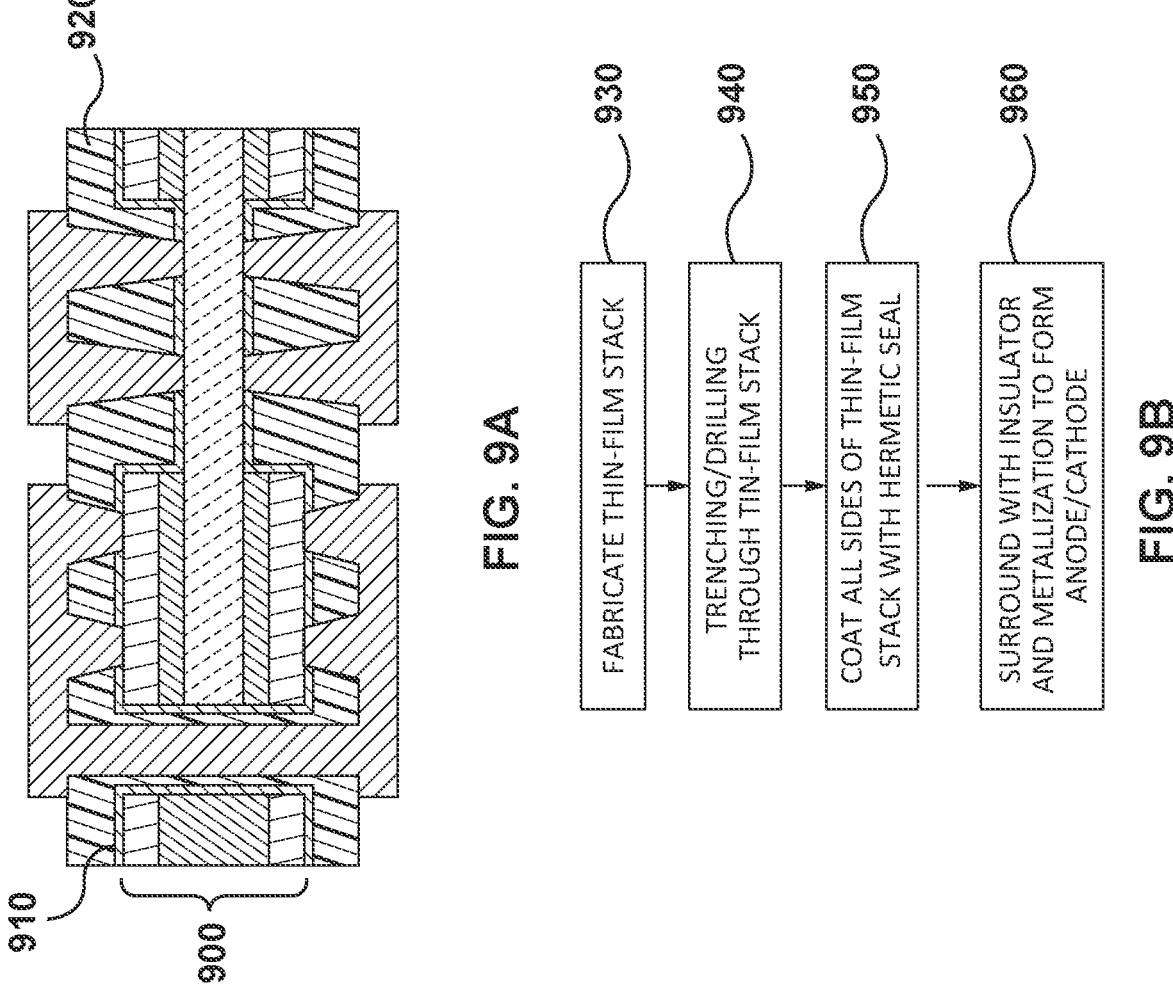
FIG. 9A shows a cross section view of an embodiment of thin-film stacks that are sealed after drilling the vertical connections and before insulator and metal formation, according to aspects of the invention.
FIG. 9B is a flowchart of a method of fabricating a plurality of sealed thin-film capacitors of FIG. 9A.
Figures 10, 11:
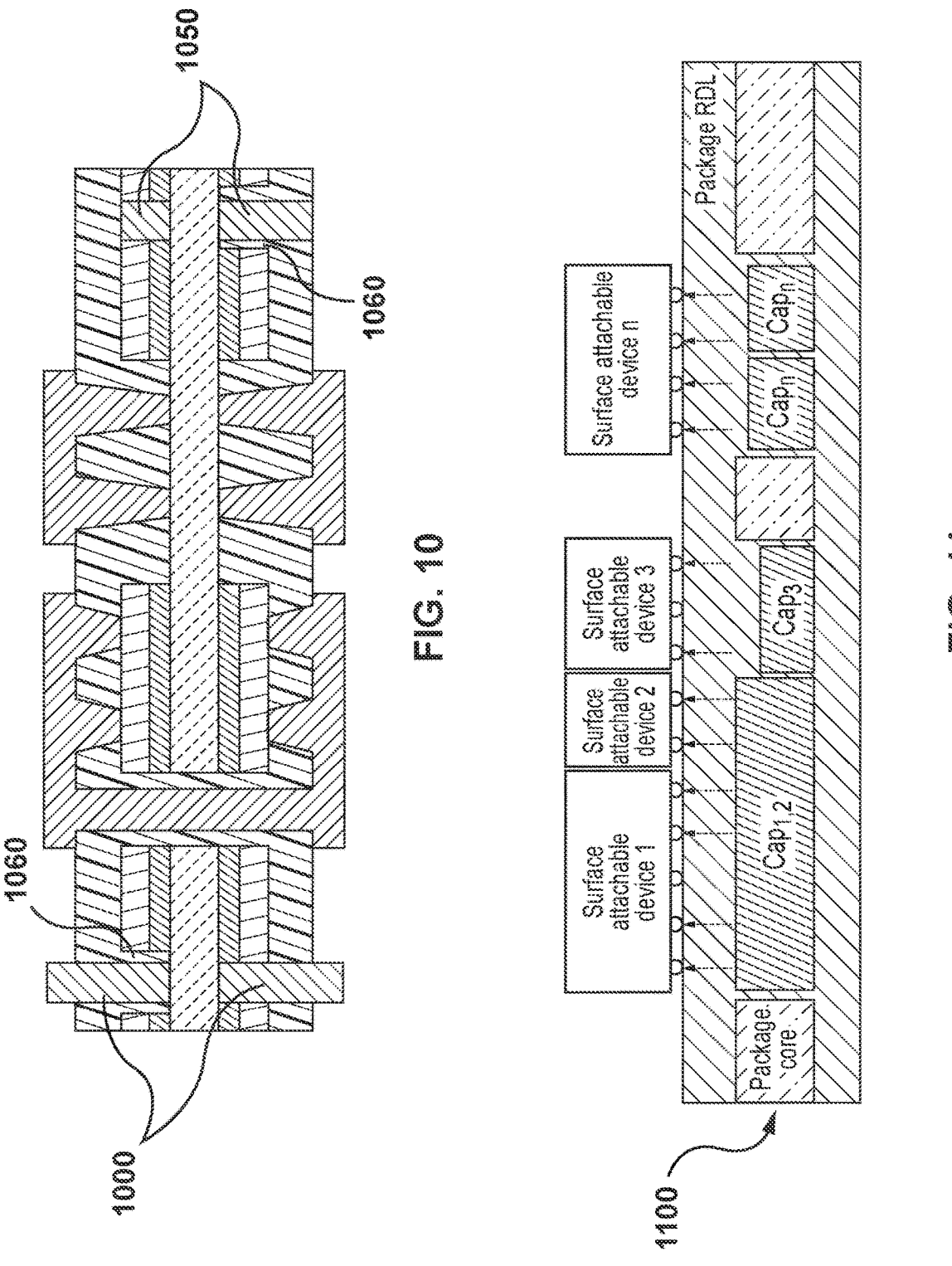
FIG. 10 shows a cross section view of an embodiment of thin-film stacks that are sealed using a seal ring that surrounds the capacitor(s).
FIG. 11 shows a cross section view of an embodiment of semiconductor package with a single or combination of capacitors underneath a single or combination of surface attachable devices' shadow.

With respect to the third general aspect, FIGS. 4-9 show cross section views of different embodiments of thin-film capacitors that are sealed after drilling the vias/PTH trenches) and terminal metal plating to complete the capacitors, while FIGS. 8 and 9 show cross section views of different embodiments of thin-film stacks that are hermetically sealed before drilling the via/PTH trenches and metal plating to complete the capacitors, and FIG. 10 shows a seal ring around the capacitor(s) according to aspects of the invention. Since the capacitor embodiments set forth in this specification can be sensitive to moisture, the seal functions as a barrier to prevent moisture/gas/chemicals, etc. from penetrating the functional layers of the capacitor(s).

Figures 4A, 4B:
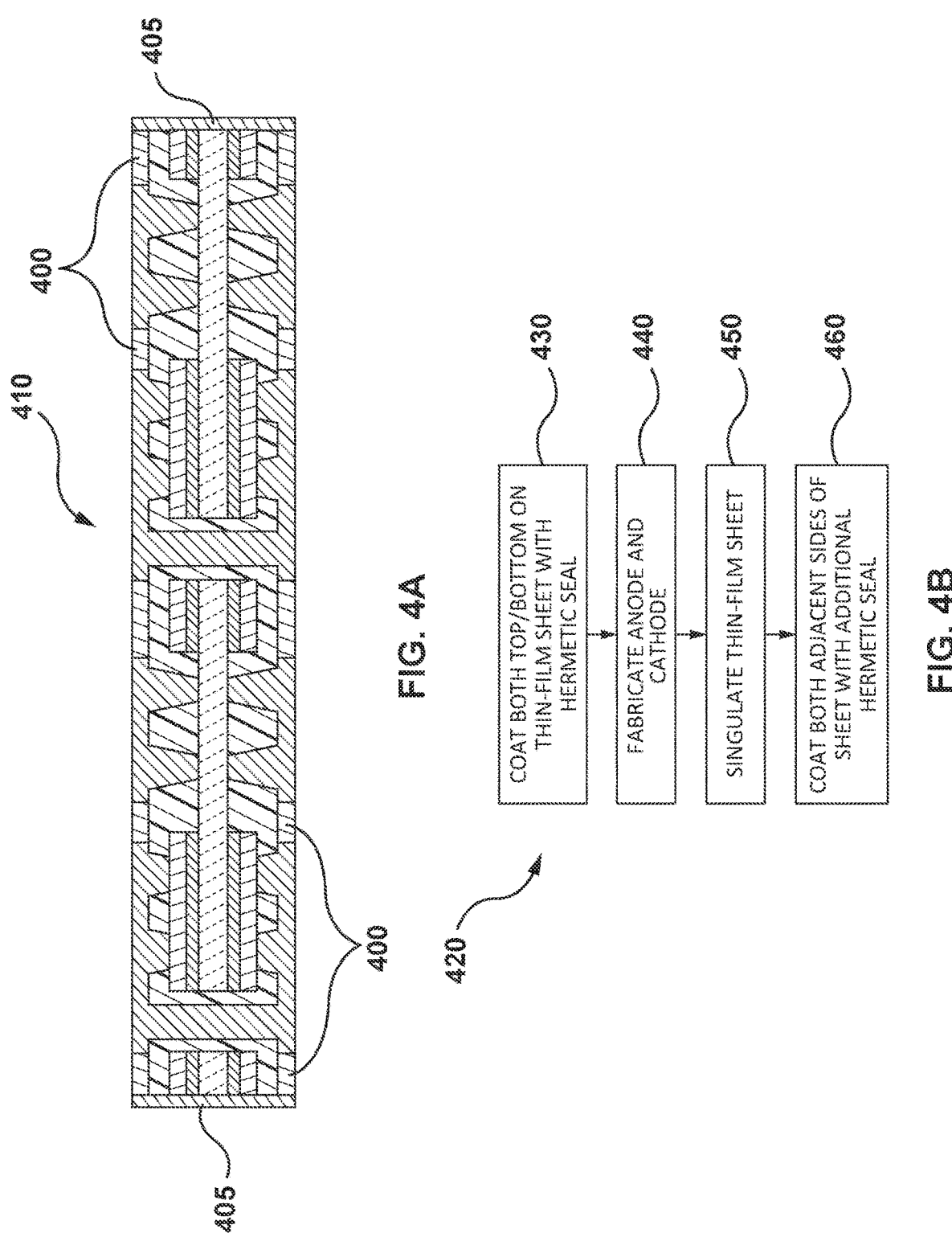
FIG. 4A shows a cross section view of thin-film capacitors that are sealed before singulation and after drilling vertical connections and metal plating to complete the capacitors, according to aspects of the invention.
FIG. 4B is a flowchart of a method of fabricating a plurality of sealed thin-film capacitors of FIG. 4A.

With reference to FIG. 4A, a thin-film capacitor is shown where a seal 400 is applied before singulation of the thin film sheet 410 into multiple capacitors. After vertical connections (e.g. via holes/PTHs) have been drilled, terminal contacts made etc., the sheet 410 is coated with hermetic or near-hermetic material 400 and then cut (singulated) into sections (e.g. a single capacitor or network/series of capacitors) that can then be embedded into the substrate core of a package. Although the top and bottom surfaces are sealed, the side walls are exposed, which requires adding an additional seal 405 during or after embedding the capacitor(s) in the substrate core, as discussed below with reference to FIGS. SA and 5B.

With reference to FIG. 4B, steps of a method 420 of fabricating a plurality of hermetically sealed thin-film capacitors are shown. At 430, both sides (i.e. the planar top and bottom surfaces) of the thin film sheet 410 are coated with a hermetic seal, wherein the thin film sheet includes the structures shown in FIGS. 3, 3A, 3B, 3C and 3D, namely an insulator 305, a conductive core 310 within the insulator, and a current collector 320 separated from the conductive core by a dielectric 330. The top and bottom surfaces can be coated using any of a number of known techniques, such as dipping, spinning, etc. At step 440, at least one first terminal is fabricated forming one of either a cathode or anode connected to the conductive core 310 through the insulator 305, and at least one second terminal forming the other of either the cathode or anode connected to the current collector 320. In some embodiments, the anode and cathode terminals can be fabricated by sputtering metal through a mask on top of the hermetic seal 400. At 450, the thin film sheet 410 is singulated into a plurality of individual thin-film capacitors that are hermetically sealed on the both planar sides (i.e. top and bottom) while unsealed on adjacent sides (i.e. exposed left and right sides where singulation occurs). Then, at 460, the unsealed adjacent sides are coated with an additional hermetic seal 405.

Figures 5, 6:
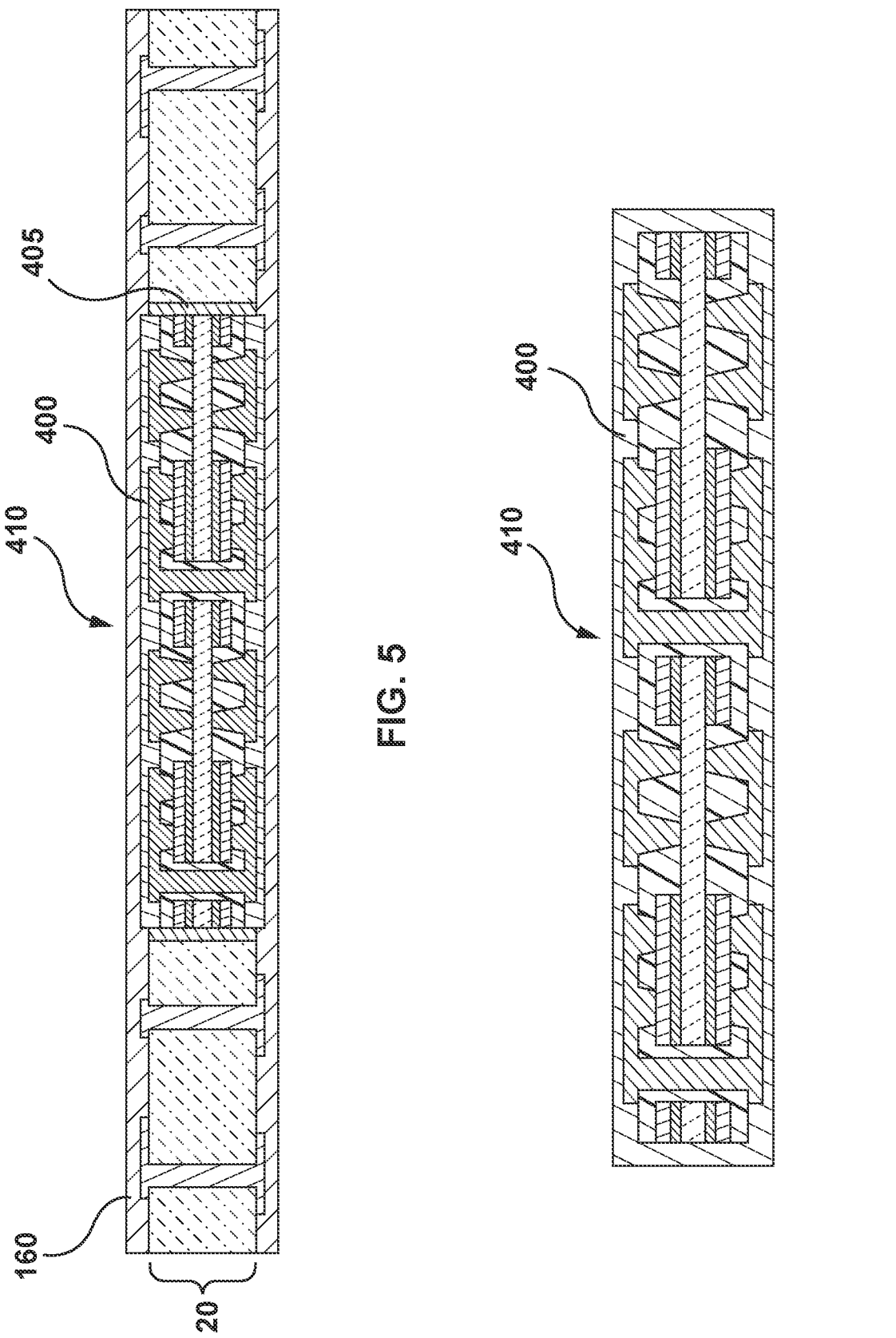
FIG. 5 shows a cross section view of thin-film capacitors that are sealed while embedding in a flip chip substrate core, according to aspects of the invention.
FIG. 6 shows a cross section view of thin-film capacitors that are sealed after singulation and before embedding in a flip chip substrate core, according to aspects of the invention.

In the embodiment of FIG. 5, the additional hermetic seal 405 is applied during embedding of the capacitors in the substrate core 120, for example by gap-filling the sides of the thin-film sheet, and thereafter singulating the sheet.

Alternatively, as shown in the embodiment of FIG. 6 the thin film sheet 410 can be singulated, sealed on all sides with hermetic seal 400 and the individual sealed capacitors (or network of capacitors) thereafter be embedded in the substrate core.

Figures 7A, 7B:
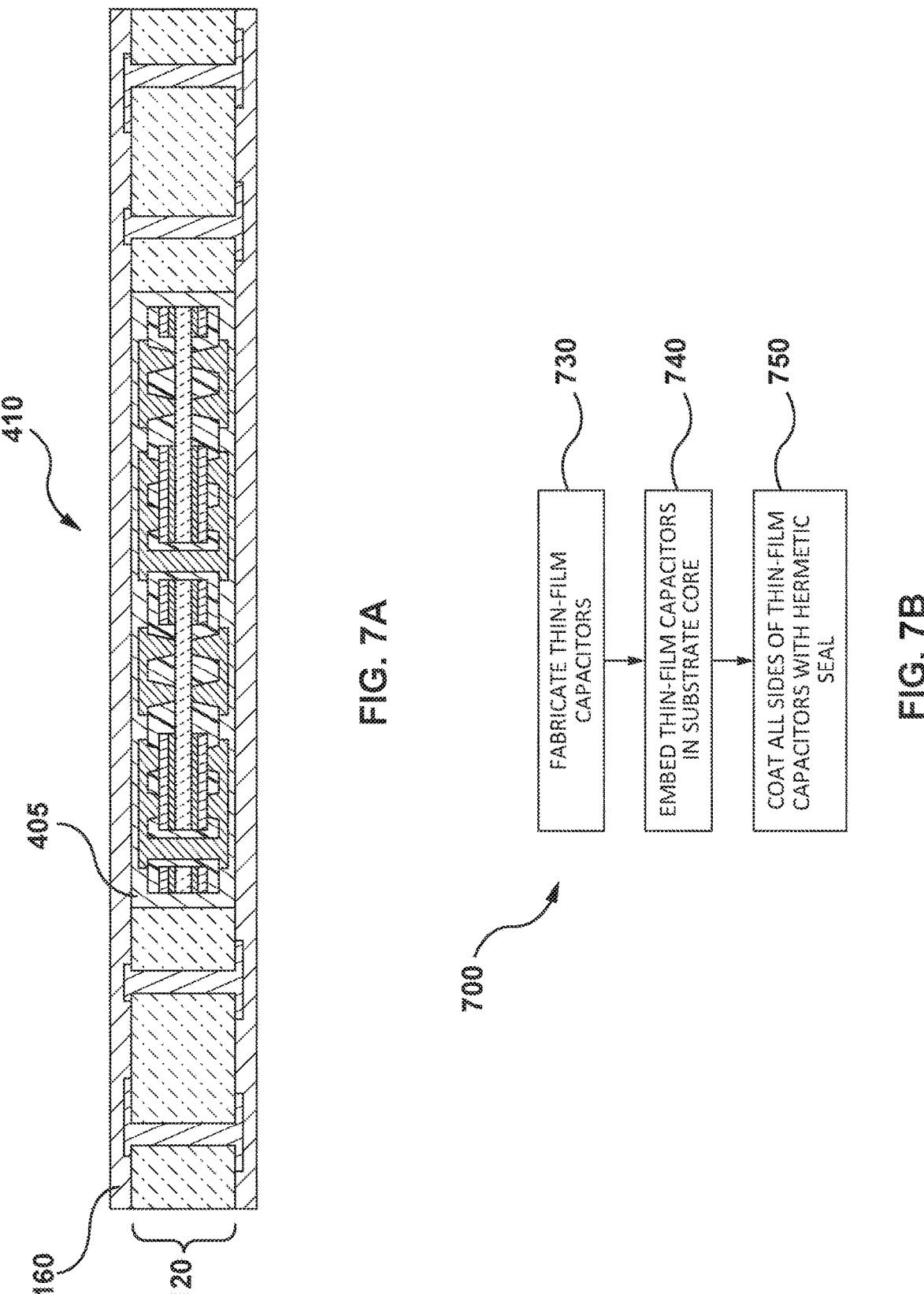
FIG. 7A shows a cross section view of thin-film capacitors that are sealed using gap filling after embedding in a flip chip substrate core, according to aspects of the invention.
FIG. 7B is a flowchart of a method of fabricating a plurality of sealed thin-film capacitors of FIG. 7A.

In the embodiment of FIG. 7A, the singulated and sealed thin film sheet of FIG. 6 is gap sealed after embedding using, for example, the method 700 of FIG. 7B, where at step 730 at least one thin-film capacitor is fabricated, having an insulator 305, a conductive core 310 within the insulator, and a current collector 320 separated from the conductive core by a dielectric 330, as well as vias/PTHs and anode/cathode terminal contacts. At 740, the at least one thin-film capacitor is embedded in the substrate core 120. Then, at 750, all sides of the embedded thin-film capacitor are coated using gap-filling with a hermetic seal 405.

Figures 8A, 8B:
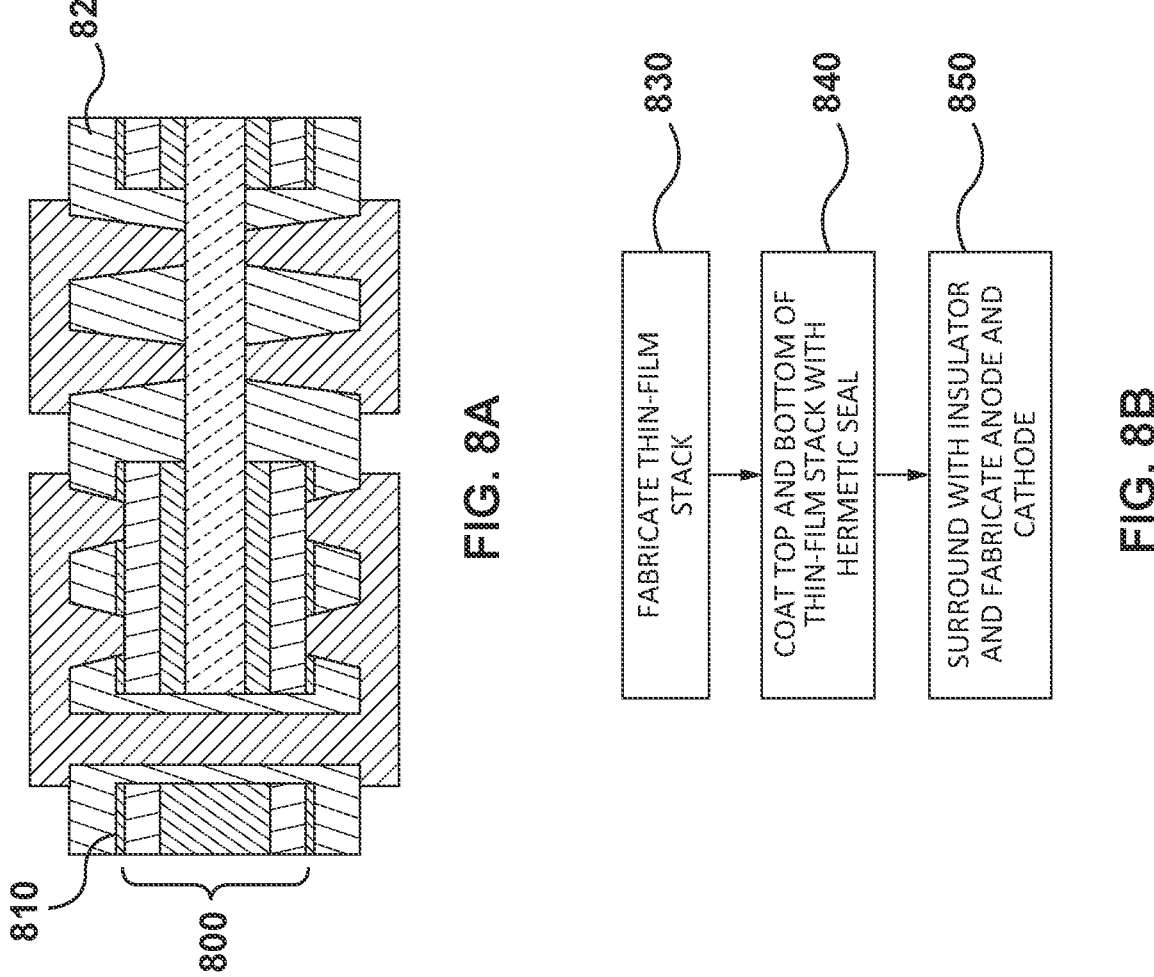
FIG. 8A shows a cross-section view of an embodiment of thin-film stacks that are sealed before drilling the vertical connections and metal plating to complete the capacitors, according to aspects of the invention.
FIG. 8B is a flowchart of a method of fabricating a plurality of sealed thin-film capacitors of Figure 8A.

Turning to FIG. SA, embodiments are shown where the thin-film stack 800 comprising conductive core, current collector and dielectric are coated with a hermetic seal 810 before encapsulating in insulator 820 and drilling for trenching/Via/PTH to fabricate terminals and DC passthrough, where most of the capacitor area is sealed although not the sides of the thin-film stack 800. FIG. 8B shows steps for fabricating the structures of Figure SA. At step 830, the thin-film stack 800 is fabricated, including the insulator, conductive core within the insulator, and a current collector separated from the conductive core by the dielectric. At 840, top and bottom surfaces of the thin-film stack are coated with a hermetic seal. Then, at 850; a first terminal is fabricated (for example using via/PTH drilling followed by metallization) forming one of either the cathode or anode connected to the conductive core through the hermetic seal and insulator, and a second terminal is fabricated forming the other of either the cathode or anode connected to the current collector through the insulator and hermetic seal.

As an alternative to the embodiments of Figure SA, the hermetic seal can be applied after trenching and drilling but before embedding the thin film stack in the insulator and metalizing to form anode and cathode terminals, resulting in the structure of FIG. 9A, where all sides of the thin film stack 900 are covered with sealant. FIG. 9B shows steps for fabricating the structures of FIG. 9A. At step 930, the thin-film stack 900 is fabricated, including the insulator, conductive core within the insulator, and a current collector separated from the conductive core by the dielectric. At 940, drilling/and trenching of vias/PTHs is performed. At step 950, all sides of the thin-film stack are coated with a hermetic seal. Then, at 960; the thin-film stack is surrounded with insulator and anode/cathode contact terminals and DC pass through are fabricated through the vias/PTH holes drilled at step 940.

As a further alternative to the embodiments of Figures SA and 9A, a seal ring 1000/1050 can surround the capacitor(s) that acts as a barrier to moisture, gas, chemicals, etc. entering the dielectric and current collector, as shown in FIG. 10, where the height of the barrier can extend to the top and bottom/terminal metal as shown at 1000, or be the same as the functional layer thickness of the thin-film stack, as shown at 1050. Also, as shown at 1060, a recess may be provided around the seal ring 1000/1050.

FIG. 11 shows a cross section view of an embodiment of semiconductor package 1100 with area dependent cathode and anode for better ESR/ESL and current carrying capability. In FIG. 11, capacitors Cap1,2, Cap3 and Capn are drawn fully custom within the package core in order to meet individual capacitance and current handling capabilities. Furthermore, the surface attachable device outline of each device (e.g. surface attachable device 3) or a combination of adjacent devices (e.g. surface attachable devices 1 and 2, and surface attachable devices n) represents a "shadow" within which the underlying capacitor(s) is/are fabricated. Thus, in FIG. 11, Cap1,2 is located in the shadow of surface attachable devices 1 and 2, Cap2 is located in the shadow of surface attachable device 3 and two Capn capacitors are located in the shadow of surface attachable device n. Connections between the capacitors and surface attachable devices is through the package RDL, as discussed above. Also, the capacitors may be of different sizes and-thicknesses. As can be seen, a single capacitor can thereby service a single surface attachable device under its shadow, or multiple surface attachable devices under their combined shadow, and multiple capacitors can service a single surface attachable devices under its shadow. In summary, each capacitor can follow the physical layout or profile of each domain/functional block of a single surface attachable device.

The present invention has been described with respect to various alternatives and embodiments.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

The invention claimed is:

1. A package comprising:
a substrate core having a top surface and a bottom surface;
a capacitor having a top surface and a bottom surface, the capacitor forming at least a portion of the substrate core with the top surface of the capacitor substantially co-planar with the top surface of the substrate core and the bottom surface of the capacitor substantially co-planar with the bottom surface of the substrate core;
a top redistribution layer formed on the top surface of the substrate core, and adapted to facilitate electrical connection to the top surface of the capacitor;
a bottom redistribution layer formed on the bottom surface of the substrate core, and adapted to facilitate electrical connection to the bottom surface of the capacitor; and

10 an electrical connection extending vertically through the capacitor, but electrically isolated from the capacitor;
wherein the capacitor is further characterized as comprising a thin-film capacitor, comprising:
an insulator;
a conductive core within the insulator;
at least one first terminal forming one of either a cathode or anode connected to the conductive core through the insulator;
a current collector separated from the conductive core by a dielectric; and
at least one second terminal forming the other of either the cathode or anode connected to the current collector.

2. The thin-film capacitor of claim 1, wherein the first terminal is connected to one of either a top or bottom surface of the conductive core using multiple blind vias.

3. The thin-film capacitor of claim 1, wherein the first terminal is connected to a side surface of the conductive core using at least one plated-through hole.

4. The thin-film capacitor of claim 1, wherein the second terminal includes at least one plated-through hole for passing DC current through the conductive core.

5. The thin-film capacitor of claim 1, wherein the second terminal is connected to the current collector using a plurality of ganged vias and a plurality of plated-through holes for passing DC current through the conductive core.

6. The thin-film capacitor of claim 5, wherein the plurality of ganged vias and plurality of plated-through holes are respectively ganged together in respective slots in the insulator.

7. The thin-film capacitor of claim 4, wherein the second terminal is connected to the current collector through a first trench filled with a conductor and wherein the at least one plated-through hole for passing DC current comprises a second trench filled with a conductor.

8. The thin-film capacitor of claim 6, wherein the slots are rectangular.

9. The thin-film capacitor of claim 7, wherein the first trench and second trench are rectangular.

10. The thin-film capacitor of claim 6, wherein the slots are non-rectangular.

11. The thin-film capacitor of claim 7, wherein the first trench and second trench are non-rectangular.

12. A package comprising:
a substrate core having a top surface and a bottom surface;
a capacitor embedded in the substrate core, the capacitor having a top surface and a bottom surface, the capacitor forming at least a portion of the substrate core with the top surface of the capacitor substantially co-planar with the top surface of the substrate core and the bottom surface of the capacitor substantially co-planar with the bottom surface of the substrate core;
a top redistribution layer formed on the top surface of the substrate core, and adapted to facilitate electrical connection to the top surface of the capacitor;
a bottom redistribution layer formed on the bottom surface of the substrate core, and adapted to facilitate electrical connection to the bottom surface of the capacitor;
an electrical connection extending vertically through the capacitor, but electrically isolated from the capacitor;
fine pitch wiring between different surface attachable devices on the package; and
coarser density wiring to connect the surface attachable devices to the external circuitry.

13. The improvement of claim 12, wherein the capacitor comprises multiple capacitors of different shapes, sizes, and thicknesses within the outline of a respective overlying surface attachable device.

14. A package adapted to couple a semiconductor die to external circuitry, the package comprising:

a substrate core having a top surface and a bottom surface;

a capacitor having a top surface and a bottom surface, the capacitor forming at least a portion of the substrate core with the top surface of the capacitor substantially co-planar with the top surface of the substrate core and the bottom surface of the capacitor substantially co-planar with the bottom surface of the substrate core;

a top redistribution layer formed on the top surface of the substrate core, and adapted to facilitate electrical connection to the top surface of the capacitor;

a bottom redistribution layer formed on the bottom surface of the substrate core, and adapted to facilitate electrical connection to the bottom surface of the capacitor; and an electrical connection extending vertically through the capacitor, but electrically isolated from the capacitor;

wherein the capacitor is embedded in the substrate core; and wherein the package includes fine pitch wiring between different surface attachable devices on the package, and coarser density wiring to connect the surface attachable devices to the external circuitry.

15. A package comprising:

a substrate core having a top surface and a bottom surface;

a capacitor having a top surface and a bottom surface, the capacitor being embedded in the substrate core and forming at least a portion of the substrate core with the top surface of the capacitor substantially co-planar with the top surface of the substrate core and the bottom surface of the capacitor substantially co-planar with the bottom surface of the substrate core;

a top redistribution layer formed on the top surface of the substrate core, and adapted to facilitate electrical connection to the top surface of the capacitor;

a bottom redistribution layer formed on the bottom surface of the substrate core, and adapted to facilitate electrical connection to the bottom surface of the capacitor; and an electrical connection extending vertically through the capacitor, but electrically isolated from the capacitor;

wherein the package includes fine pitch wiring between different surface attachable devices on the package, and coarser density wiring to connect the surface attachable devices to the external circuitry.

16. A package comprising:

a substrate core having a top surface and a bottom surface;

a capacitor comprising multiple components embedded in the substrate core, the capacitor having a top surface and a bottom surface, the capacitor forming at least a portion of the substrate core with the top surface of the capacitor substantially co-planar with the top surface of the substrate core and the bottom surface of the capacitor substantially co-planar with the bottom surface of the substrate core;

a top redistribution layer formed on the top surface of the substrate core, and adapted to facilitate electrical connection to the top surface of the capacitor;

a bottom redistribution layer formed on the bottom surface of the substrate core, and adapted to facilitate electrical connection to the bottom surface of the capacitor;

an electrical connection extending vertically through the capacitor, but electrically isolated from the capacitor; and a terminal metal in the capacitor configured as an alignment fiducial onto which at least one vertical connection can be dropped from at least one of said top surface of the substrate core and said bottom surface of the substrate core.

17. A package comprising:

a substrate core having a top surface and a bottom surface;

a capacitor having a top surface and a bottom surface, the capacitor forming at least a portion of the substrate core with the top surface of the capacitor substantially co-planar with the top surface of the substrate core and the bottom surface of the capacitor substantially co-planar with the bottom surface of the substrate core;

a top redistribution layer formed on the top surface of the substrate core, and adapted to facilitate electrical connection to the top surface of the capacitor;

a bottom redistribution layer formed on the bottom surface of the substrate core, and adapted to facilitate electrical connection to the bottom surface of the capacitor; and an electrical connection extending vertically through the capacitor, but electrically isolated from the capacitor;

wherein the capacitor is further characterized as comprising multiple capacitors of different shapes, sizes, and thicknesses within the outline of a respective overlying surface attachable device.

\* \* \* \* \*